(12) United States Patent
Stanley et al.

(10) Patent No.: US 8,889,489 B2
(45) Date of Patent: *Nov. 18, 2014

(54) METAL INJECTION MOLDED HEAT DISSIPATION DEVICE

(75) Inventors: Gavin D. Stanley, Puyallup, WA (US); Michael T. Crocker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/586,028

(22) Filed: Aug. 15, 2012

(65) Prior Publication Data

US 2013/0168844 A1    Jul. 4, 2013

Related U.S. Application Data

(63) Continuation of application No. 12/323,318, filed on Nov. 25, 2008, now Pat. No. 8,259,451.

(51) Int. Cl.

| | |
|---|---|
| *H01L 23/34* | (2006.01) |
| *H05K 7/20* | (2006.01) |
| *H01L 23/473* | (2006.01) |
| *H01L 23/373* | (2006.01) |
| *F28F 13/00* | (2006.01) |

(52) U.S. Cl.
CPC ............ *H05K 7/2039* (2013.01); *H01L 23/473* (2013.01); *H01L 23/3733* (2013.01); *F28F 13/00* (2013.01); *H01L 23/34* (2013.01)
USPC ............ 438/122; 361/700; 361/702; 257/714

(58) Field of Classification Search
USPC .......... 361/689, 699–703; 257/712, 713, 714, 257/717; 438/122
See application file for complete search history.

(56) References Cited

U.S. PATENT DOCUMENTS

| | | |
|---|---|---|
| 4,730,665 A | 3/1988 | Cutchaw |
| 4,823,863 A | 4/1989 | Nakajima et al. |
| 5,126,829 A | 6/1992 | Daikoku et al. |
| 5,402,004 A | 3/1995 | Ozmat |
| 6,018,616 A | 1/2000 | Schaper |
| 6,154,363 A | 11/2000 | Chang |
| 7,690,419 B2 | 4/2010 | Thayer et al. |
| 7,882,624 B2 | 2/2011 | Hu et al. |
| 8,259,451 B2 * | 9/2012 | Stanley et al. ............... 361/700 |
| 2008/0185713 A1 | 8/2008 | Dani et al. |

\* cited by examiner

*Primary Examiner* — Kevin M Picardat
(74) *Attorney, Agent, or Firm* — International IP Law Group, P.C.

(57) ABSTRACT

A heat dissipation device is provided. The heat dissipation device includes an integrated heat spreader and a base plate coupled to the integrated heat spreader, wherein the base plate comprises a plurality of metal pellets to dissipate heat from the integrated heat spreader.

24 Claims, 5 Drawing Sheets

METAL INJECTION MOLDED HEAT DISSIPATION DEVICE

CROSS REFERENCE TO RELATED APPLICATIONS

This application is related and claims priority to U.S. patent application Ser. No. 12/323,318 titled "METAL INJECTION MOLDED HEAT DISSIPATION DEVICE" which was filed on Nov. 25, 2008; this application is entirely incorporated by reference.

BACKGROUND

With recent advancements in the semiconductor manufacturing technology microelectronic components are becoming smaller and circuitry within such components is becoming increasingly dense. As the circuit density increases, heat generation from such components also increases. Various techniques are employed to dissipate the heat generated from the components. For example, a heat dissipating device such as an integrated heat spreader and a heat sink such as a multi-fin heat sink may be employed to dissipate the generated heat to the surrounding environment.

The multi-fin heat sink includes thin densely packed fin arrays that rely on very small hydraulic diameters in fluid channels between fins to generate heat transfer coefficients for dissipating the heat to the surrounding environment. However, manufacturing of these fin arrays is a challenge and quite expensive. Further, additional components such as a pump may be required to provide the adequate pressure for use of such heat sinks.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a heat dissipation device for dissipating the heat from a microelectronic package. In particular, the technique uses a metal injection molded base plate having a plurality of metal pellets that function as microfins to dissipate the heat from the microelectronic package.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Figure 1:
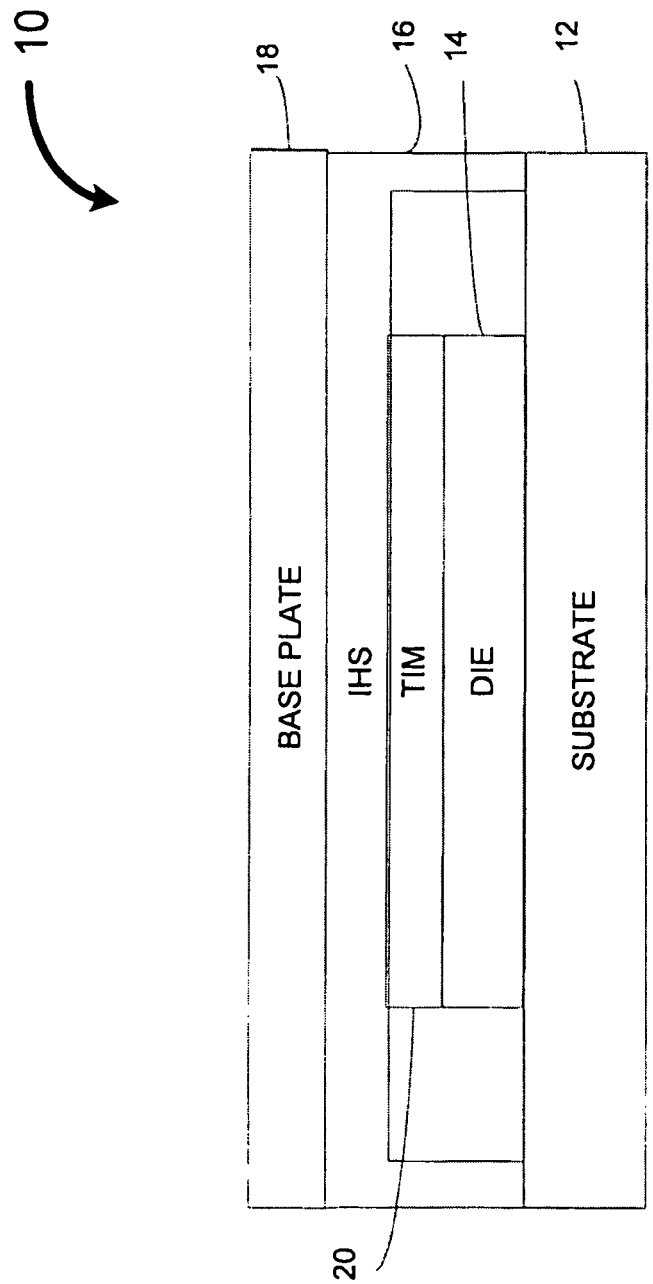
FIG. 1 illustrates a microelectronic package in accordance with embodiments of present technique.

Referring first to FIG. 1, a microelectronic package 10 is illustrated. The microelectronic package 10 includes a substrate 12 and a die 14 coupled to the substrate 12. The substrate 12 may be formed of a variety of materials including ceramic and printed circuit boards. Further, the substrate 12 may be a one-layer board or a multi-layer board. In certain embodiments, the die 14 forms one of a data storage device, a digital signal processor, a micro-controller and a hand-held device. Typically, the die 14 is attached to one side of the substrate 12 and the attachment may be through a plurality of solder balls or solder bump connections (not shown), among other attachment methods.

The microelectronic package 10 includes an integrated heat spreader (IHS) 16 and a base plate 18 coupled to the integrated heat spreader 16 for dissipating the heat generated from the microelectronic package 10 to the surrounding environment. The integrated heat spreader 16 may be formed of a suitable conductive material such as copper, aluminum and carbon composites, among others. In certain embodiments, the base plate 18 may be directly coupled to the die 14. Further, in certain embodiments, the base plate 18 is in thermal contact with the integrated heat spreader 16 through a thermal interface material (not shown). Examples of the thermal interface material include, but are not limited to, a grease, a polymer, a solder and a polymer solder hybrid (PSH). In this exemplary embodiment, the base plate 18 includes a plurality of solid conducting pellets (not shown) to facilitate the heat dissipation to the surrounding environment. In certain embodiments, the base plate 18 includes a plurality of metal pellets. In one exemplary embodiment, the base plate 18 comprises a metal injection molded plate having a plurality of copper pellets. In another exemplary embodiment, the base plate 18 comprises a metal injection molded plate having a plurality of aluminum pellets. However, other metals such as magnesium, tungsten, nickel and silver may be employed as the metal pellets for the base plate 18. In certain other embodiments, alloys of metals such as magnesium, tungsten, nickel, silver, brass and bronze may be employed for the conducting pellets for the base plate 18.

The plurality of metal pellets function as microfins to dissipate the heat from the microelectronic package 10 to the surrounding environment. In certain embodiments, a coolant fluid such as water may be circulated through the plurality of metal pellets to facilitate the heat dissipation. In one exemplary embodiment, a porosity of the base plate 18 with the plurality of metal pellets is between about 10% to about 50%.

In one exemplary embodiment, a size of each of the plurality of metal pellets is between about 25 microns and about 400 microns. In one exemplary embodiment, the size of each of the plurality of metal pellets is about 200 microns. It should be noted that metal pellets having varying sizes may be employed for the base plate 18.

In the microelectronic package 10, the integrated heat transfer device 16 is in thermal contact with the die 14 through a thermal interface material (TIM) 20. As illustrated, the thermal interface material 20 is disposed between the die 14 and the integrated heat spreader 16. Examples of the thermal interface material 20 include, but are not limited to, a grease, a polymer, a solder and a polymer solder hybrid (PSH).

In operation, heat is typically conducted from the die 14 through the thermal interface material 20 to the integrated heat spreader 16 by heat conduction. Further, the heat is transferred from the integrated heat spreader 16 to the base plate 18 and the convective heat transfer primarily transfers the heat from the base plate 18 to the surrounding environment. In certain embodiments, a base plate 18 is coupled to the integrated heat spreader 16 through a thermal interface material (not shown) to facilitate the heat transfer from the integrated heat spreader 16 to the base plate 18.

Figure 2:
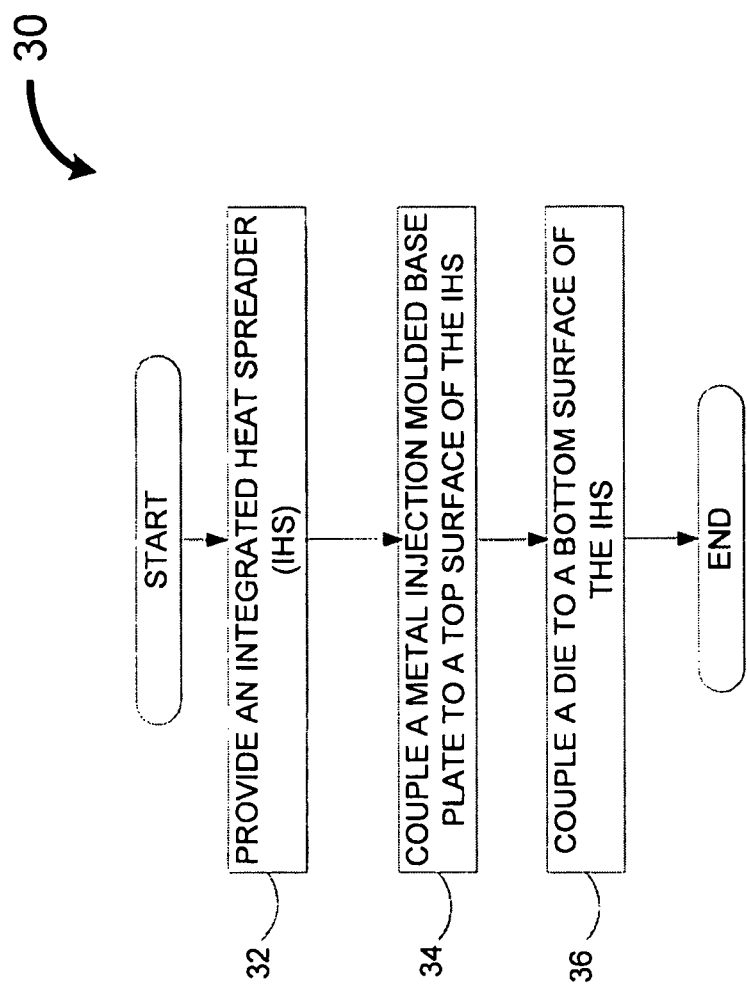
FIG. 2 illustrates an exemplary method for forming a microelectronic package in accordance with embodiments of present technique.

FIG. 2 illustrates an exemplary method 30 for forming a microelectronic package. At block 32, an integrated heat spreader is provided. Further, a metal injection molded base plate is coupled to a top surface of the integrated heat spreader (block 34). In this embodiment, the metal injection molded base plate includes a plurality of metal pellets that function as microfins to dissipate heat from the integrated heat spreader. In one exemplary embodiment, the metal injection molded base plate includes a plurality of copper pellets. In another exemplary embodiment, the metal injection molded base plate includes a plurality of aluminum pellets. However, other metals may be used for the metal pellets. In certain embodiments, a porosity of the base plate with the metal pellets is between about 10% and about 50%. In one exemplary embodiment, the porosity of the base plate with the metal pellets is between 10% and about 20%.

At block 36, a die is coupled to a bottom surface of the integrated heat spreader. In certain embodiments, the die forms one of a data storage device, a digital signal processor, a micro-controller and a hand-held device. In certain embodiments, the integrated heat spreader is in thermal contact with the die through a thermal interface material (TIM). Examples of the thermal interface material include, but are not limited to, a grease, a polymer, a solder and a polymer solder hybrid (PSH). In certain embodiments, the integrated heat spreader is coupled to the die to form a package. Subsequently the base plate is coupled to the package. In certain embodiments, a thermal interface material is employed between the base plate and the integrated heat spreader.

Figure 3:
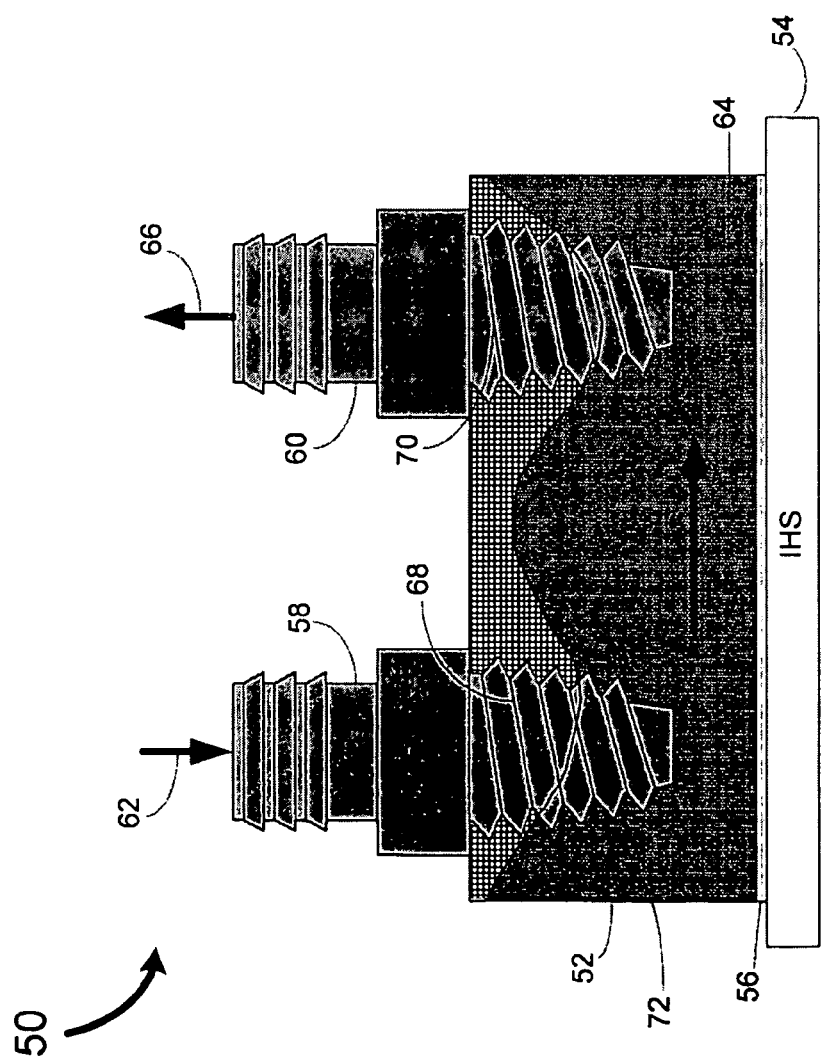
FIG. 3 illustrates an exemplary configuration of a metal injection molded base plate coupled to an integrated heat spreader in accordance with embodiments of present technique.
Figure 5:
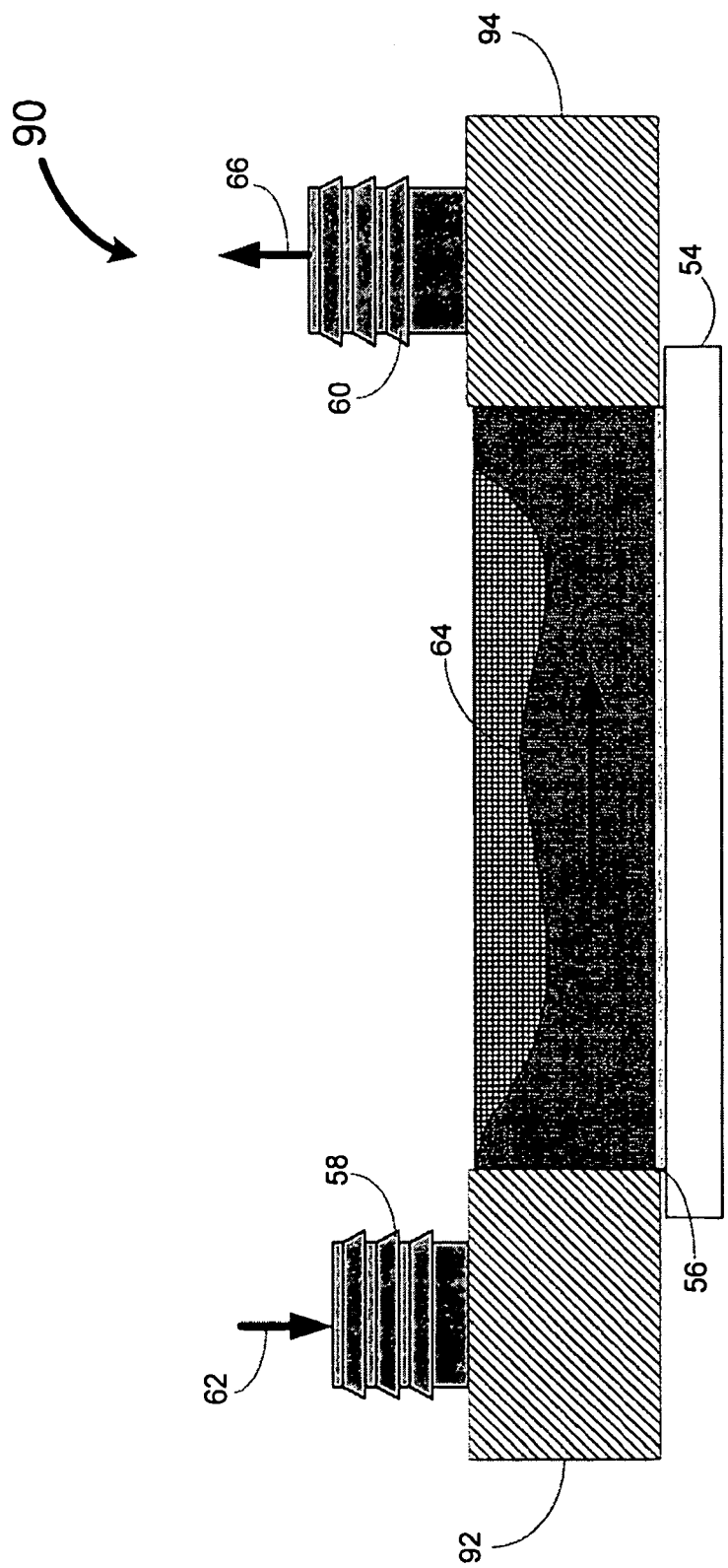
FIG. 5 illustrates an exemplary configuration of the metal injection molded base plate coupled to the integrated heat spreader in accordance with embodiments of present technique.

In this exemplary embodiment, an inlet hose and an outlet hose is coupled to the metal injection molded base plate for circulating a coolant fluid within the plurality of metal pellets. In one exemplary embodiment, the coolant fluid includes water. Further a sealant material may be disposed adjacent to the metal injection molded base plate to prevent any leakage of the coolant fluid. FIGS. 3 and 5 illustrate exemplary configurations of the metal injection molded base plate coupled to the integrated heat spreader.

FIG. 3 illustrates an exemplary configuration 50 of a metal injection molded base plate 52 coupled to an integrated heat spreader 54. In the illustrated embodiments, the metal injection molded base plate 52 includes a plurality of metal pellets (not shown) that function as microfins to dissipate the heat from the integrated heat spreader. In this exemplary embodiment, the metal injection molded base plate 52 is coupled to the integrated heat spreader 54 through a thermal interface material 56. Examples of the thermal interface material 56 include, but are not limited to, a grease, a polymer, a solder and a polymer solder hybrid (PSH). As previously described, the metal injection molded base plate 52 may be coupled to a silicon bare die or any other electronic component package.

An inlet hose coupling 58 with an coupled inlet hose (not shown) and an outlet hose coupling 60 with an coupled outlet hose (not shown) is connected to the metal injection molded base plate 52 for circulating a coolant fluid (not shown) such as water through the plurality of metal pellets. The coolant fluid facilitates the heat dissipation to the surrounding environment. In operation, the coolant fluid is introduced into the metal injection molded base plate 52 through the inlet hose coupling 58, as represented by reference numeral 62. Further, the coolant fluid absorbs the heat as it passes through the metal injection molded base plate 52, as represented by reference numeral 64. The coolant fluid is subsequently removed through the outlet hose coupling 60, as represented by reference numeral 66.

In the illustrated embodiment, the inlet and outlet hose couplings 58 and 60 are coupled to the metal injection molded base plate 52 through threaded hose connectors 68 and 70 respectively. However, a variety of coupling mechanisms may be employed to couple the inlet and outlet hose couplings 58 and 60 to the metal injection molded base plate 52. Further, a sealant material 72 is disposed adjacent to the metal injection molded base plate 52 to prevent leakage of the coolant fluid. In one exemplary embodiment, the sealant material 72 includes eutectic solder. Other examples of the sealant material 72 include, but are not limited to, electroless nickel plating, chrome and zinc plating.

Figure 4:
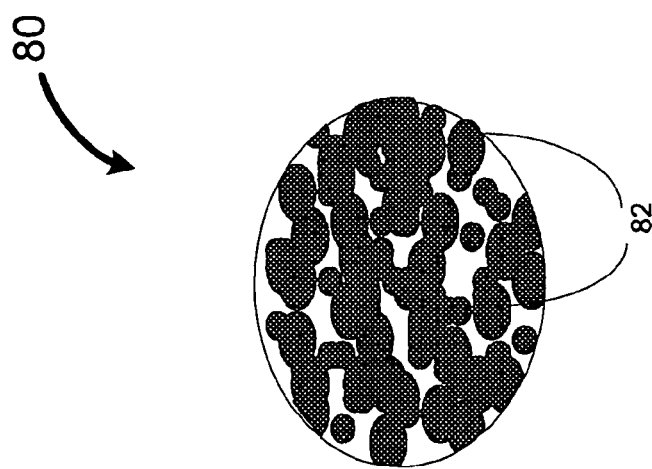
FIG. 4 illustrates an exemplary zoomed view of a portion of the metal injection molded base plate of FIG. 3 in accordance with embodiments of present technique.

FIG. 4 illustrates an exemplary zoomed view 80 of a portion of the metal injection molded base plate 52 of FIG. 3. As illustrated, the metal injection molded base plate 80 includes a plurality of metal pellets such as represented by reference numeral 82. In one exemplary embodiment, the metal injection molded base plate includes a plurality of copper pellets 82. In another exemplary embodiment, the metal injection molded base plate includes a plurality of aluminum pellets 82. However, a variety of other metals may be employed for the metal pellets 82. In this exemplary embodiment, the plurality of metal pellets 82 are coupled for providing a thermally conductive path between the solid material and an open porous path for the fluid.

In certain embodiments, the heat dissipation through the metal injection molded base plate 82 is based upon a porosity of metal injection molded base plate with the metal pellets 82. In one embodiment, the porosity of the metal injection molded base plate 82 is between about 10% and about 50%. In one exemplary embodiment, the porosity of the metal injection molded base plate 82 is between about 10% and about 20%. In one exemplary embodiment and a combination of sizes of each of the plurality of metal pellets 82 is between 25 microns and about 400 microns. In one exemplary embodiment, the size of each of the plurality of metal pellets is about 200 microns. It should be noted that metal pellets 82 having varying sizes may be employed for the base plate 18.

FIG. 5 illustrates another exemplary configuration 90 of the metal injection molded base plate 52 (see FIG. 3) coupled to the integrated heat spreader 54 (see FIG. 3). As with the configuration 50 of FIG. 3, the metal injection molded base plate 52 is coupled to the integrated heat spreader through the thermal interface material 56. In this exemplary embodiment, the inlet and outlet hose couplings 58 and 60 are coupled to the metal injection molded base plate 52 through soldered connectors 92 and 94 respectively. Again, a coolant fluid such as water is circulated through the metal injection molded base plate 52 through the inlet and outlet hose couplings 58 and 60, as represented by reference numerals 62, 64 and 66. The coolant fluid passes through the plurality of metal pellets 82 (see FIG. 4) of the metal injection molded base plate 52 which facilitate the heat transfer to the surrounding environment.

Figure 6:
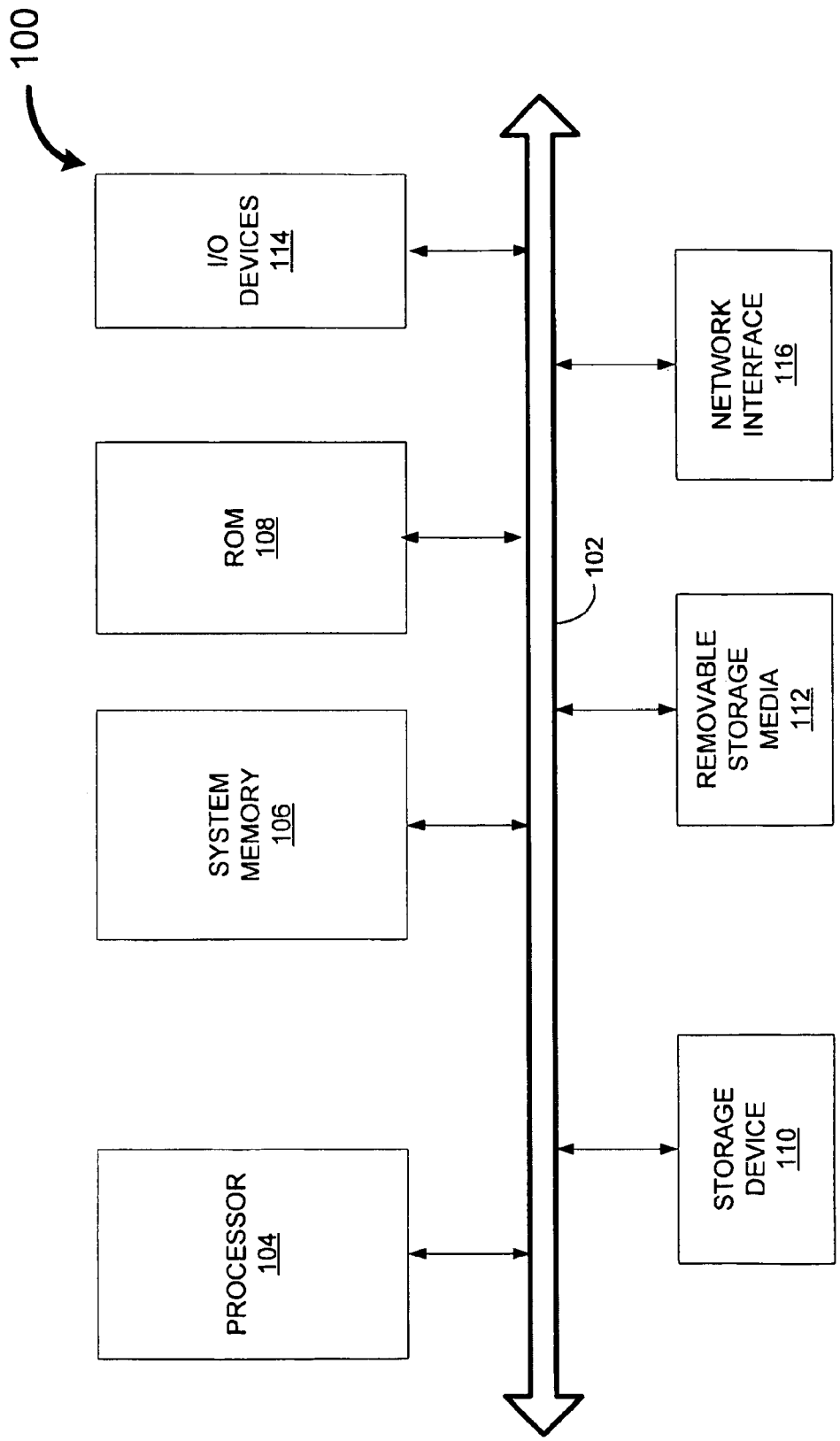
FIG. 6 illustrates an embodiment of a computer system.

The microelectronic package described above may be disposed in a computer system, a wireless communicator and a hand-held device. FIG. 6 illustrates an embodiment of a computer system 100. The computer system 100 includes a bus 102 to which the various components are coupled. In certain embodiments, the bus 102 includes a collection of a plurality of buses such as a system bus, a Peripheral Component Interface (PCI) bus, a Small Computer System Interface (SCSI) bus, etc. Representation of these buses as a single bus 102 is provided for ease of illustration, and it should be understood that the system 100 is not so limited. Those of ordinary skill in the art will appreciate that the computer system 100 may have any suitable bus architecture and may include any number of combination of buses.

A processor 104 is coupled to the bus 102. The processor 104 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 6 shows a single processor 104, the computer system 100 may include two or more processors.

The computer system 100 further includes system memory 106 coupled to the bus 102. The system memory 106 may include any suitable type and number of memories, such as static random access memory (SRAM), dynamic random access memory (DRAM), synchronous dynamic random access memory (SDRAM), or double data rate DRAM (DDRDRAM). During operation of the computer system 100, an operating system and other applications may be resident in the system memory 106.

The computer system 100 may further include a read-only memory (ROM) 108 coupled to the bus 102. The ROM 108 may store instructions for the processor 104. The computer system 100 may also include a storage device (or devices) 110 coupled to the bus 102. The storage device 110 includes any suitable non-volatile memory, such as, for example, a hard disk drive. The operating system and other programs may be stored in the storage device 110. Further, a device 112 for accessing removable storage media (e.g., a floppy disk drive or a CD ROM drive) may be coupled to the bus 102.

The computer system 100 may also include one or more Input/Output (I/O) devices 114 coupled to the bus 102. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 100.

The computer system 100 may further comprise a network interface 116 coupled to the bus 102. The network interface 116 comprises any suitable hardware, software, or combination of hardware and software that is capable of coupling the system 100 with a network (e.g., a network interface card). The network interface 116 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (Hyper-Text Transmission Protocol, as well as others.

It should be understood that the computer system 100 illustrated in FIG. 6 is intended to represent an embodiment of such a system and, further, that this system may include any additional components, which have been omitted for clarity and ease of understanding. By way of example, the system 100 may include a direct memory access (DMA) controller, a chip set associated with the processor 104, additional memory (e.g., cache memory) as well as additional signal lines and buses. Also, it should be understood that the computer system 100 may not include all the components shown in FIG. 6. The computer system 100 may comprise any type of computing device, such as a desktop computer, a laptop computer, a server, a hand-held computing device, a wireless communication device, an entertainment system etc.

In this embodiment, the computer system 100 may include the device as described in the embodiments above. By way of example, the processor 104 may include a heat dissipation device that includes an integrated heat spreader and a base plate coupled to the integrated heat spreader, wherein the base plate comprises a plurality of metal pellets to dissipate heat from the integrated heat spreader.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A base plate for dissipating heat
    wherein the base plate is a metal injection molded plate, and the base plate comprises a plurality of conducting pellets.

2. The base plate of claim 1, wherein the base plate is coupled with an integrated heat spreader.

3. The base plate of claim 1, wherein the plurality of conducting pellets comprises a plurality of copper pellets.

4. The base plate of claim 1, wherein the plurality of conducting pellets comprises a plurality of aluminum pellets.

5. The base plate of claim 1, wherein a porosity of the plurality of conducting pellets is between about 10% and about 50%.

6. The base plate of claim 1, wherein a size of each of the plurality of conducting pellets is between about 20 microns and 400 microns.

7. The base plate of claim 1, further comprising inlet and outlet hose couplings coupled to the base plate, wherein the inlet and outlet hose couplings are to circulate a coolant fluid through the plurality of conducting pellets of the base plate.

8. The base plate of claim 7, wherein the inlet and outlet hose couplings are coupled to the base plate through threaded hose connectors.

9. The base plate of claim 7, wherein the inlet and outlet hose couplings are coupled to the base plate through soldered hose connectors.

10. The base plate of claim 7, further comprising a sealant material disposed adjacent to the base plate to substantially prevent leakage of the coolant fluid from the base plate.

11. The base plate of claim 10, wherein the sealant material comprises eutectic solder.

12. A microelectronic package, comprising
    a base plate that is a metal injection molded plate, wherein the base plate comprises a plurality of conducting pellets to dissipate heat from an integrated heat spreader.

13. The microelectronic package of claim 12, wherein the plurality of conducting pellets comprises a plurality of copper pellets.

14. The microelectronic package of claim 12, wherein the plurality of conducting pellets comprises a plurality of aluminum pellets.

15. The microelectronic package of claim 12, wherein a porosity of the base plate with the plurality of metal pellets is between about 10% and about 50%.

16. A method of forming a base plate, comprising:
a metal injection molded plate, wherein the metal injection molded plate employs a plurality of conducting pellets to dissipate heat.

17. The method of claim 16, further comprising coupling inlet and outlet hose couplings to the metal injection molded base plate for circulating a coolant fluid within the plurality of metal pellets.

18. The method of claim 16, wherein the plurality of conducting pellets comprises a plurality of copper pellets.

19. The method of claim 16, wherein the plurality of conducting pellets comprises a plurality of aluminum pellets.

20. The method of claim 16, further comprising disposing a sealant material adjacent to the metal injection molded plate.

21. The base plate of claim 1, wherein a porosity of the plurality of conducting pellets is between 10% and 50%.

22. The base plate of claim 1, wherein a size of each of the plurality of conducting pellets is between 20 microns and 400 microns.

23. The base plate of claim 1, wherein a porosity of the plurality of conducting pellets is between substantially 10% and substantially 50%.

24. The base plate of claim 1, wherein a size of each of the plurality of conducting pellets is between substantially 20 microns and substantially 400 microns.

* * * * *